United States Patent [19]
Dobuzinsky et al.

[11] Patent Number: 5,563,105
[45] Date of Patent: Oct. 8, 1996

[54] PECVD METHOD OF DEPOSITING FLUORINE DOPED OXIDE USING A FLUORINE PRECURSOR CONTAINING A GLASS-FORMING ELEMENT

[75] Inventors: David M. Dobuzinsky, Hopewell Junction; Tetsuo Matsuda, Poughkeepsie; Son V. Nguyen, Hopewell Junction, all of N.Y.; James G. Ryan, Newton, Conn.; Michael Shapiro, Beacon, N.Y.

[73] Assignee: International Business Machines Corporation, Armonk, N.Y.

[21] Appl. No.: 316,302

[22] Filed: Sep. 30, 1994

[51] Int. Cl.$^6$ .............................................. H01L 21/316
[52] U.S. Cl. ............................................................ 437/240
[58] Field of Search ..................................... 437/238, 240, 437/241

[56] References Cited

U.S. PATENT DOCUMENTS

| | | | |
|---|---|---|---|
| 4,246,296 | 1/1981 | Chang | 427/38 |
| 4,386,163 | 5/1983 | Kodama | 501/44 |
| 4,397,670 | 8/1983 | Beall | 65/33 |
| 4,539,068 | 9/1985 | Takagi et al. | 156/614 |
| 4,894,352 | 1/1990 | Lane et al. | 437/238 |
| 5,124,278 | 6/1992 | Bohling et al. | 437/126 |
| 5,215,787 | 6/1993 | Homma | 427/248.1 |
| 5,254,505 | 10/1993 | Kamiyama | 437/235 |
| 5,279,865 | 1/1994 | Chebi et al. | 427/574 |
| 5,281,557 | 1/1994 | Yu | 437/235 |
| 5,395,796 | 3/1995 | Haskell et al. | 437/195 |
| 5,413,967 | 5/1995 | Matsuda et al. | 437/235 |

FOREIGN PATENT DOCUMENTS

| | | | |
|---|---|---|---|
| 60-144940 | 7/1985 | Japan | H01L 21/316 |
| 3-36767 | 2/1991 | Japan | H01L 29/784 |
| 5135876 | 6/1993 | Japan | H01L 21/205 |

OTHER PUBLICATIONS

Takamori, "Process for Melting Multi–Component Oxyfluoride Glasses", IBM Tech. Disc. Bulletin, V22, N12, May 1980, pp. 5464–5465.
Afzali et al., "Passivation of the Aluminum Film of Direct Negative–Direct Plate", IBM Tech. Disc. Bulletin, V32, N8B, Jan. 1990, p. 465.
Bezama et al., "Microstructure and TCE Control for Glass Ceramic Substrates by Controlled Glass in Glass Phase Separation", IBM Tech. Disc. Bulletin, V33 N4, Sep. 1990, pp. 446–447.
Ida et al., "Reduction of Wiring Capacitance with New Low Dielectric SiOF Interlayer Film for High Speed/Low Power Sub–half Micron CMOS", 1994 Symposium on VLSI Tech. Digest of Technical Papers, Apr. 1994, pp. 59–60.
Fukada et al., "Preparation of SiOF Films with Low Dielectric Constant by ECR Plasma Chemical Vapor Deposition", Ext. Abstracts of the 1993 Int. Conf. on Solid State Devices and Materials, 1993, pp. 158–160.
Anand et al., "Fully Integrated Back End of the Line Interconnect Process for High Performance ULSIs", 1994 VMIC Conference, Jun. 7–8, 1994, pp. 15–21.
Usami et al., "Low Dielectric Constant Interlayer Using Fluorine–Doped Silicon Oxide", Jpn. J. Appl. Phys. vol. 33 (1994) Pt. 1, No. 1B, pp. 408–412.
Hidehiko, Nonaka, 'Photochemical Vapor . . . Mechanism', J. Appl. Phys., 64(8), 15 Oct. 1988.
Wolf, Stanley, 'Si Proc. for the VLSI Era', vol. 2, (1990), p. 362.

Primary Examiner—R. Bruce Breneman
Assistant Examiner—Matthew Whipple

[57] ABSTRACT

Fluorine-doped oxide is formed that is resistant to water absorption by the use of two sources of silicon, one being the fluorine precursor and the other being available to react with excess fluorine from the fluorine precursor, thereby reducing the number of fluorine radicals in the layer; the fluorine precursor containing a glass-forming element that combines with the other glass constituents to carry into the gas a diatomic radical containing one atom of fluorine and one atom of the glass-forming element.

20 Claims, 4 Drawing Sheets

PECVD METHOD OF DEPOSITING FLUORINE DOPED OXIDE USING A FLUORINE PRECURSOR CONTAINING A GLASS-FORMING ELEMENT

TECHNICAL FIELD

The field of the invention is that of integrated circuits, in particular the formation of oxide dielectric layers doped with fluorine.

BACKGROUND ART

In the interests of providing higher speed, the art has searched for dielectric layers having a lower dielectric constant. It has been suggested in an article by J. Ida, et al entitled "Reduction of Wiring Capacitance with New Dielectric SiOF Interlayer Film for High Speed/Low Power Sub-Half Micron CMOS", 1994 Symposium on VLSI Technology Digest of Technical Papers 0-7803-19212-4/94 IEEE, that the use of $C_2F_6$ in connection with TEOS ($Si(OC_2H_5)_4$) may provide a silicon dioxide (oxide) layer with fluorine doping (fluorosilicate glass or F-glass) that provides such a lower dielectric constant. Another suggestion in an article by Fukada and Akahori entitled "Preparation of SiOF Films with Low Dielectric Constant by ECR Plasma Chemical Vapor Deposition" in Extended Abstracts of the 1993 International Conference on Solid State Devices and Materials, Makuhari, 1993 pp. 158–160, has been the use of silicon tetrafluoride ($SiF_4$) in connection with $O_2$. An article by Anand, et al entitled "Fully Integrated Back End of the Line Interconnect Process for High Performance ULSIs" in the 1994 VMIC Conference 1994 ISIMC—103/94/0015, suggests the use of $CF_4$ and $C_2F_6$. The $C_2F_6$ method renders a film that is susceptible to the absorption of water, and the $SiF_4$ ECR deposition method is susceptible to outgassing of hydrogen fluoride or fluorine, since the excess F atoms dissociated in the high density Electron Cyclotron Resonance plasma are incorporated in the F-SiOx network as weakly bonded fluorine. When more water is absorbed and F* is lost, the fluorine forms HF, which corrodes metallization. The art has not yet found a satisfactory method of forming a stable film of F-glass with sufficiently high fluorine content to significantly lower the dielectric constant and increase gap-fill capacity.

SUMMARY OF THE INVENTION

The invention relates to a method of forming a layer of oxide incorporating fluorine in which an oxygen precursor gas containing silicon is used in connection with a glass-forming precursor gas containing glass-forming molecules to form a stable water resistant film.

An advantage of the invention is that the glass forming species can be incorporated in the deposited film in the form of Si—F without breaking up the glass network, in contrast to the incorporation of C or N.

A feature of the invention is the presence of F and H, which react with one another to remove free F and/or H that could weaken the film.

DETAILED DESCRIPTION OF THE INVENTION

Figure 1:
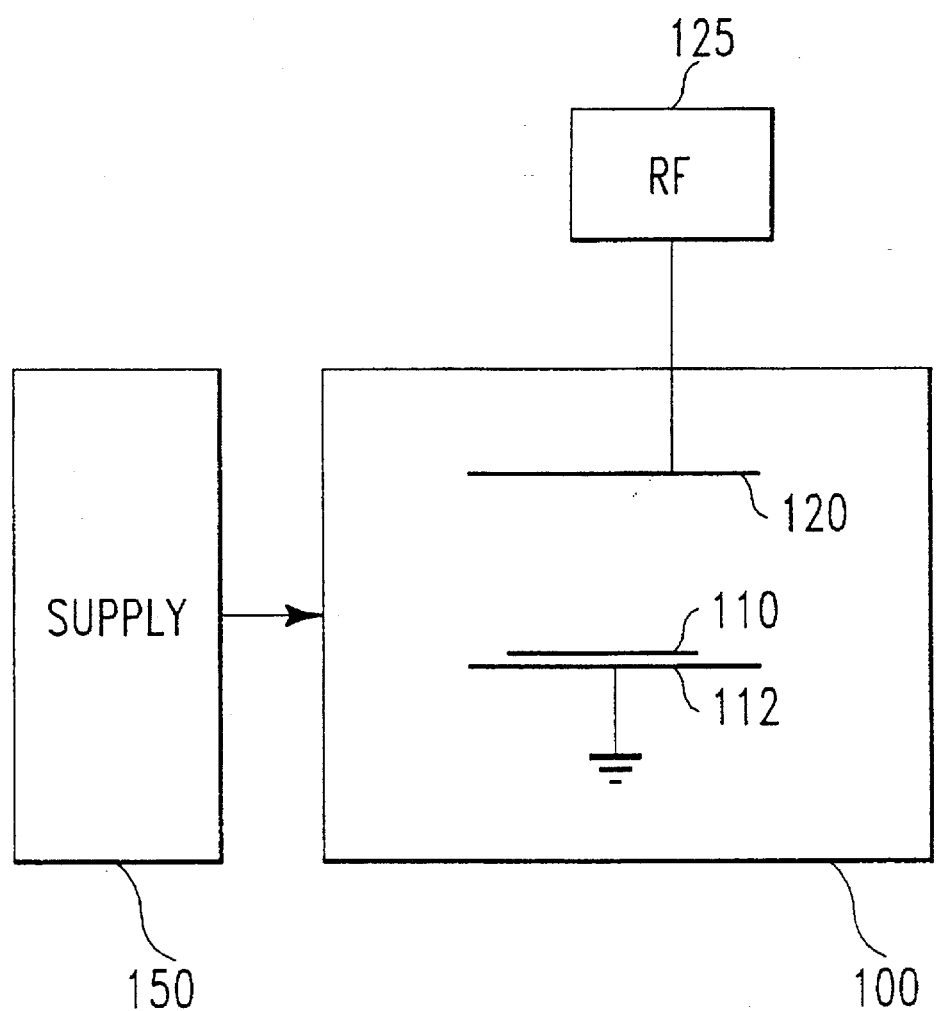
FIG. 1 illustrates schematically a reaction apparatus used in connection with the invention.

Referring now to FIG. 1, there is shown schematically a reaction apparatus such as an Applied Materials 5000 CVD reactor. At the center of the figure, reaction chamber 100 includes a grounded electrode 112 and an RF driven electrode 120. Wafer 110 rests on ground electrode 122. Driven electrode 120 is driven by an RF source 125 comprising preferably two frequency sources and a matching network. At the left of the drawing, a box labeled SUPPLY and indicated with the numeral 150 is a schematic representation of a source of gases including a carrier gas such as argon, a silicon precursor such as TEOS, and a fluorine precursor such as $SiF_4$.

In operation, the gases are mixed and pass into the chamber in a conventional manner. An oxidant is not needed in this case, since TEOS is also an oxygen source. Other configurations beside that shown in FIG. 1 may also be used for deposition. Preferably, a dual frequency apparatus is used in which power is delivered at a first frequency to create a plasma and simultaneously at a second frequency to enhance and control ion bombardment, but such a dual-frequency apparatus is not required. If a dual-frequency apparatus is used, the frequencies may be applied to either one or two electrodes.

Many methods of plasma-enhanced chemical vapor deposition (PECVD) including sub-atmospheric CVD (SACVD) in the pressure range less than 750 Torr and high density CVD (with an electron density of greater than $10^{11}$–$10^{12}$ electrons/cm$^3$) may also be used to produce satisfactory films.

In an illustrative example, a dual-frequency PECVD process was used in an Applied Materials 5000 reactor, using He as a carrier, a high frequency of 13.56 MHz and a low frequency of 0.35 MHz, with a $SiF_4$:TEOS:$O_2$ ratio of 7:1:10 at a total pressure of 5 Torr and a wafer temperature of 400° C.

In another example, $SiF_4$ and $SiH_4$ were used, together with $N_2O$, in the same apparatus and parameters at a $SiF_4$:$SiH_4$:$N_2O$ ratio of 20:1:35 at 2.8 Torr and a wafer temperature of 400° C. For the $SiF_4$:$SiH_4$:$N_2O$ gas mixture, the hydrogen precursor may be added after mixing $SiF_4$ and $N_2O$ in order to reduce particle formation. In this embodiment, an appropriate range for the ratio $R_{SiF4-SiH4}$ of $SiF_4$ to $SiH_4$ is between 1 and 200, with a preferred range for $R_{SiH4-SiF4}$ being between 10 and 50.

The fraction of fluorine in the final film will depend on a tradeoff between dielectric constant and water absorption. A film with a high fraction of F tends to absorb water and a film with a low fraction of F has a dielectric constant that is less attractive. A preferred range for the fraction of fluorine is that the ratio $R_{F-O}$ of Si—F bonds to Si—O bonds in the oxide is $1/200 \leq R_{F-O} \leq 1/4$. The preferred ratio within this range is a ratio $R_{F-O}$ of about 1/20.

Figure 2:
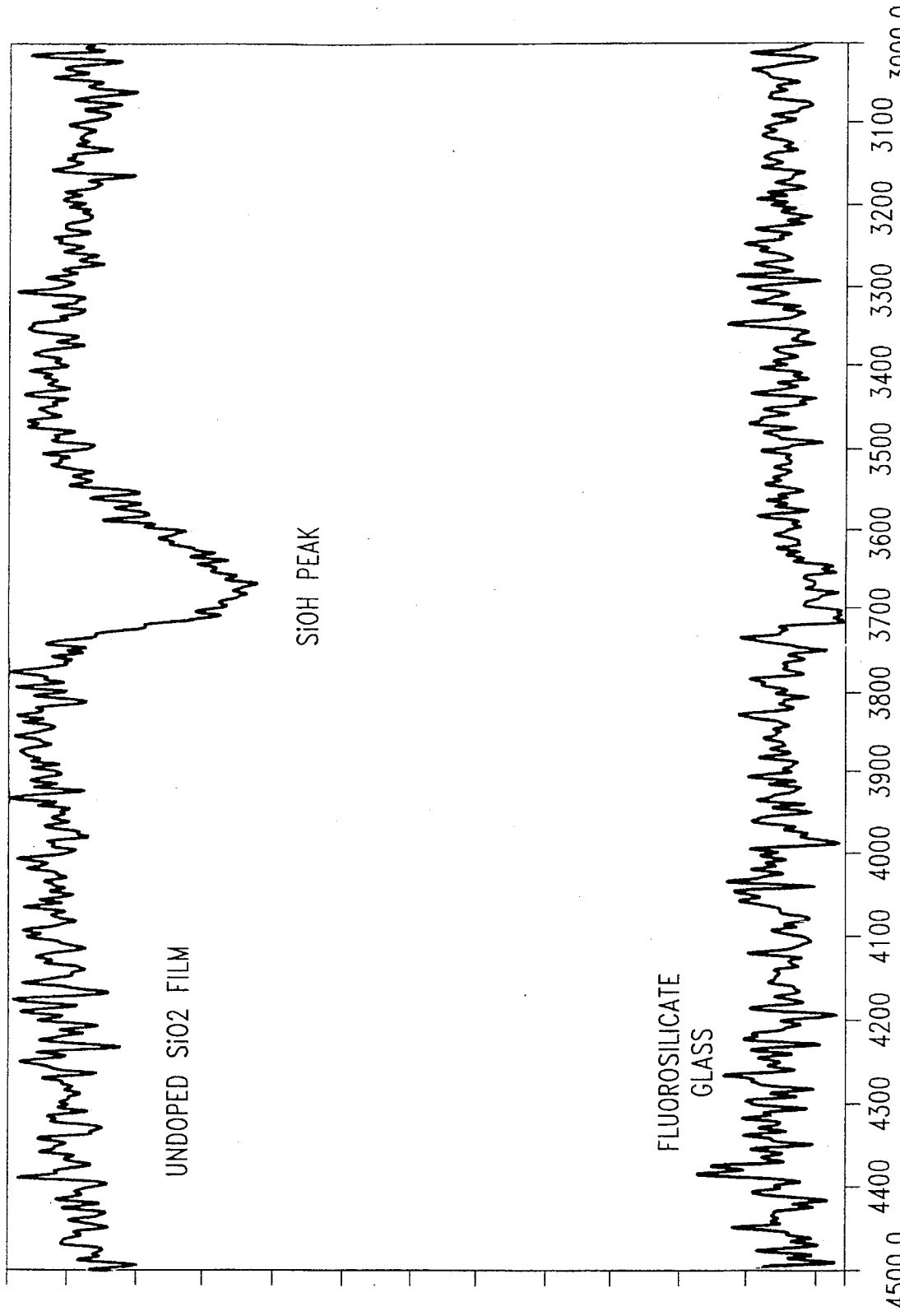
FIG. 2 illustrates an FTIR showing a comparison between undoped oxide and fluoro-silicate glass.

Referring now to FIG. 2, there is shown an FTIR (Fourier Transform Infrared Spectroscopy) plot in arbitrary units of wavenumbers on the x-axis and percentage transmittance on the y axis.

The upper trace is that of undoped oxide showing a pronounced dip indicating the presence of SiOH in the film that serves as a defect because SiOH raises the dielectric constant of oxide films, degrades the electrical properties and dissociates at high temperatures. The bottom trace, coming from a sample produced with $SiF_4$ and TEOS, shows minimal SiOH bonding which indicates a much lower SiOH concentration.

Figure 3:
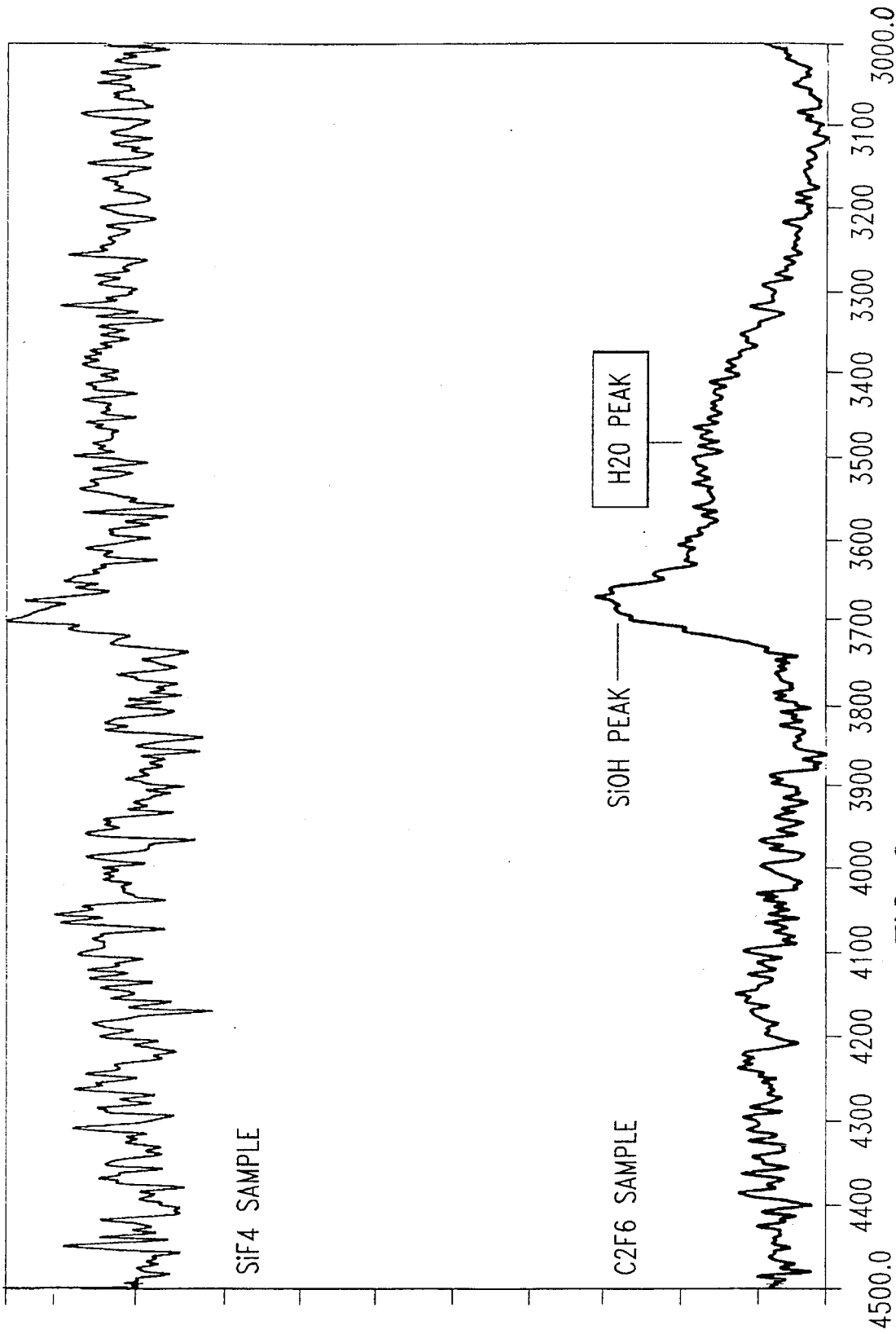
FIG. 3 illustrates a comparison of water absorption between a fluoro-silicon glass formed by the invented method and a fluoro-silicon glass formed from $C_2F_6$.

Referring now to FIG. 3, there is shown a comparison of traces for samples formed with the invented method ($SiF_4$ and TEOS) and a sample formed by the use of $C_2F_6$. A humidity test in which the films were exposed to 100% humidity at 60° C. for 24 hours indicates clearly that the $C_2F_6$ sample has absorbed a substantial amount of water and the $SiF_4$ sample has not.

Figure 4:
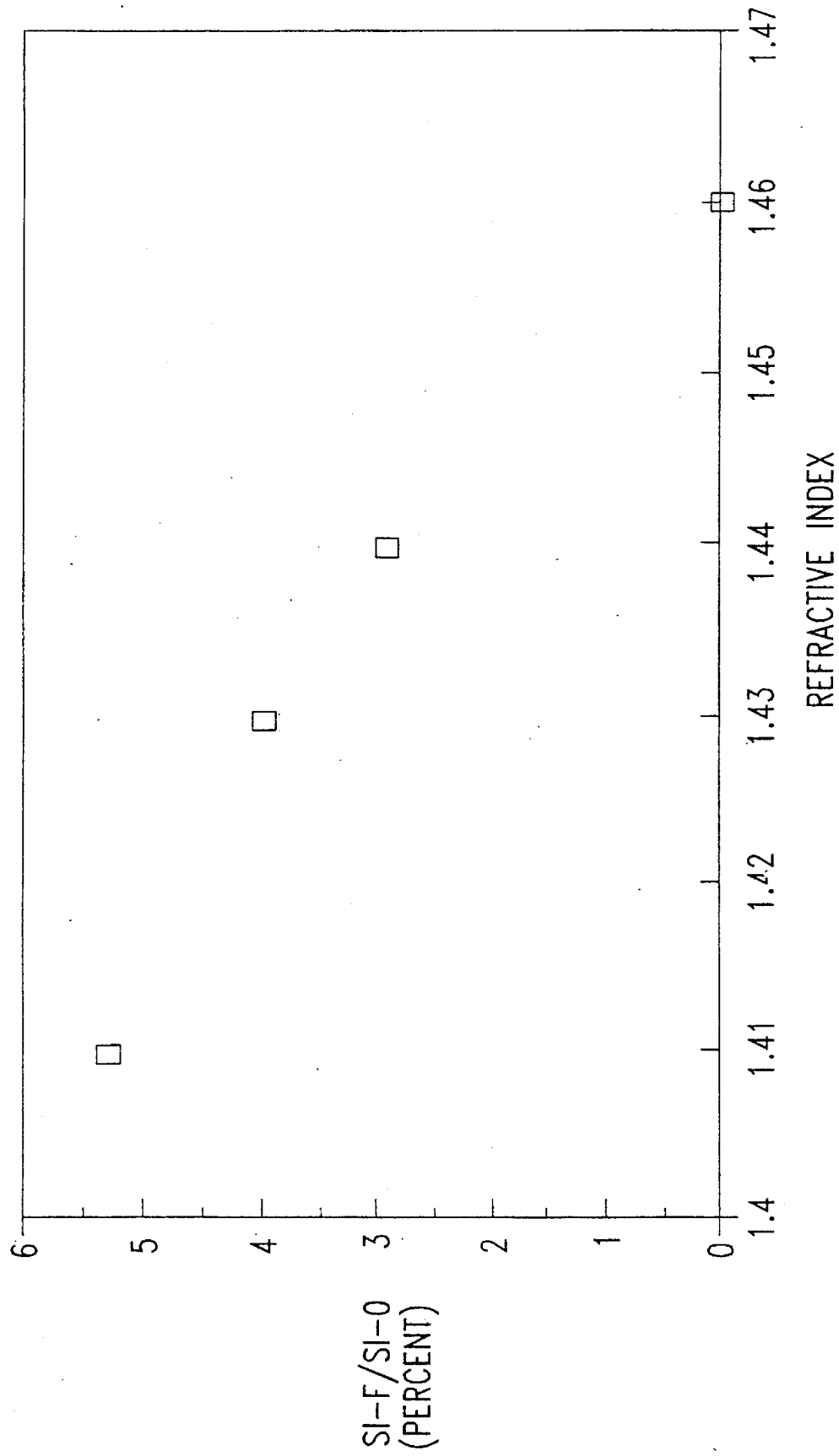
FIG. 4 illustrates variation of refractive index as a function of the ratio of Si—F bonds to Si—O bonds.

FIG. 4 shows a typical variation of refractive index (RI) versus Si—F/Si—O bonding ratio (R). It shows an inverse relationship between RI and R. For higher R, films having RI as low as 1.37 have been observed.

Those skilled in the art will appreciate that the principle of the invention can be applied in many embodiments. For example, $SiF_4$ can be replaced with $Si_xF_y$ without changing the principle of the invention. Also, TEOS can be replaced with $Si_xH_y$ and oxygen. In addition, if the well known benefits of boron or phosphorous doping are desired, $B_2H_6$, $B_2F_6$, $PH_3$, $PF_3$ or any other convenient B or P precursors can be added in any desired combination to produce boron or phosphorous doped F-glass.

An advantage of using precursors that contain a Si—F or other glass-forming element-F bond (meaning by "glass-forming" an element that is capable of forming a glassy structure, such as Si, B, P, Ge, As, Se, Sb, In, Tl, Sn, or Pb) is that radicals containing these bonds may be incorporated in the glass film without breaking up the overall glass bonding network. This is in contrast with the use of C or N precursors, which disturb the network, leading to instability of the film.

For convenience in terminology, the term "precursor gas" will be taken to include the element itself; i.e. $O_2$, as well as TEOS, will be taken to be a precursor gas for oxygen. Also, the term will be taken to include a mixture of two or more gases, as well as a single gas.

Those skilled in the art will readily appreciate that different embodiments of the invention may be made in view of the enclosed teaching and the following claims are not meant to be limited to the embodiments disclosed.

We claim:

1. A method of forming a layer of fluorosilicate glass above a semiconductor substrate comprising the steps of:

simultaneously introducing into a reaction chamber and mixing in a mixing ratio a set of gases comprising an oxygen precursor gas, a fluorine precursor gas and a source of hydrogen;

forming and maintaining a plasma in said reaction chamber, whereby said plasma interacts with at least one of said precursor gases; and forming said layer of fluorosilicate glass containing a portion of fluorine by the incorporation of radicals comprising a fluorine atom and another atom from said fluorine precursor gas, in which the ratio $R_{F-O}$ of Si—F bonds to Si—O bonds in said fluorosilicate glass is greater than 1/200 and in which said fluorine precursor gas is selected from the group of gases comprising at least one atom of fluorine and a least one atom of a glass-forming element selected from the group consisting of Si, B, P, Ge, As, Se, Sb, In, Tl, Sn, or Pb.

2. A method according to claim 1, in which said step of mixing a set of gases includes mixing an oxygen precursor gas that is also a silicon precursor gas, whereby fluorine is added to said fluorosilicate glass by forming a bond between silicon from said silicon precursor gas and fluorine atoms from said fluorine precursor gas in addition to said radicals from said fluorine precursor gas.

3. A method according to claim 1, in which at least one of said precursor gases is a source of hydrogen.

4. A method according to claim 3, in which said oxygen precursor gas is also a source of hydrogen.

5. A method according to claim 3, in which said oxygen precursor gas is an organosilicon gas.

6. A method according to claim 3, in which said oxygen precursor gas comprises a mixture of oxygen and TEOS and said fluorine precursor gas is $SiF_4$.

7. A method according to claim 6, in which said $SiF_4$, said TEOS and said $O_2$ are mixed in a ratio of about 7:1:10.

8. A method according to claim 4, in which said fluorine precursor gas is $SiF_4$.

9. A method according to claim 5, in which said fluorine precursor gas is $SiF_4$.

10. A method according to any of claims 1–3, in which said plasma is formed by RF power applied at a first frequency and simultaneously RF power is applied at a second frequency.

11. A method according to claim 10, in which the ratio $R_{F-O}$ of Si—F bonds to Si—O bonds in said fluorosilicate glass is in the range $1/200 \leq R_{F-O} \leq 1/4$.

12. A method according to claim 11, in which said ratio $R_{F-O}$ is approximately 1/20.

13. A method of forming a layer of fluorosilicate glass above a semiconductor substrate comprising the steps of:

simultaneously introducing into a reaction chamber and mixing in a mixing ratio a set of precursor gases comprising an oxygen precursor gas and at least one precursor gas for silicon and fluorine;

forming and maintaining a plasma in said reaction chamber, whereby said plasma interacts with at least one of said precursor gases; and forming said layer of fluorosilicate glass containing a portion of fluorine by the incorporation of radicals comprising a fluorine atom and another atom from said fluorine precursor gas, wherein the improvement comprises:

mixing a fluorine precursor gas that also contains a glass-forming atom selected from the group consisting of Si, B, P, Ge, As, Se, Sb, In, Tl, Sn, or Pb together with said oxygen precursor gas;

mixing a hydrogen precursor gas with said set of precursor gases, whereby hydrogen from said hydrogen precursor gas is available to react with dissociated atoms from said fluorine precursor gas; and in which the precursor gases are combined such that the ratio $R_{F-O}$ of Si—F bonds to Si—O bonds in said fluorosilicate glass is greater than 1/200.

14. A method according to claim 13, in which said silicon precursor gas is also a source of hydrogen.

15. A method according to claim 13, in which said fluorine precursor gas is $SiF_4$.

16. A method according to claim 15, in which said hydrogen precursor gas is $SiH_4$.

17. A method according to claim 16, in which said $SiF_4$ and said $SiH_4$ are mixed in a ratio $R_{SiF4-SiH4}$ having a range of between about 1 and about 200.

18. A method according to claim 17, in which said ratio $R_{SiF4-SiH4}$ has a range of about 10 to 50.

19. A method according to any of claims 13 or 14, in which said plasma is formed by RF power applied at a first frequency and simultaneously RF power is applied at a second frequency.

20. A method according to claim 19, in which the ratio $R_{F\text{-}O}$ of Si—F bonds to Si—O bonds in said fluorosilicate glass is in the range $1/200 \leq R_{F\text{-}O} \leq 1/4$.

* * * * *